(12) United States Patent
Lee et al.

(10) Patent No.: US 9,560,782 B2
(45) Date of Patent: Jan. 31, 2017

(54) WATERPROOF LOCKABLE DOOR AND PRESSURE ADJUSTED PLUG THEREOF

(71) Applicant: GETAC TECHNOLOGY CORPORATION, Hsinchu County (TW)

(72) Inventors: Kun-Cheng Lee, Taipei (TW); Juei-Chi Chang, Taipei (TW)

(73) Assignee: Getac Technology Corporation, Hsinchu County (TW)

( * ) Notice: Subject to any disclaimer, the term of this patent is extended or adjusted under 35 U.S.C. 154(b) by 377 days.

(21) Appl. No.: 14/274,625

(22) Filed: May 9, 2014

(65) Prior Publication Data

US 2015/0047262 A1 Feb. 19, 2015

Related U.S. Application Data

(60) Provisional application No. 61/865,886, filed on Aug. 14, 2013.

(30) Foreign Application Priority Data

Dec. 27, 2013 (CN) .......................... 2013 1 0737427

(51) Int. Cl.
*H05K 5/06* (2006.01)
*G06F 1/16* (2006.01)
*H05K 5/02* (2006.01)

(52) U.S. Cl.
CPC ............ *H05K 5/061* (2013.01); *G06F 1/1656* (2013.01); *G06F 1/1675* (2013.01); *H05K 5/0239* (2013.01); *H05K 5/068* (2013.01)

(58) Field of Classification Search
CPC .......................... H05K 5/0221; H05K 5/0239
See application file for complete search history.

(56) References Cited

U.S. PATENT DOCUMENTS

| | | | | |
|---|---|---|---|---|
| 6,453,603 B1* | 9/2002 | Baker | ................. | A01M 1/2011 43/124 |
| 6,662,490 B1* | 12/2003 | Aesch, Jr. | ............... | A01M 1/24 43/124 |
| 7,075,781 B2* | 7/2006 | Peng | ..................... | G06F 1/1656 361/679.55 |
| 7,789,437 B2* | 9/2010 | Sheng | ................... | G06F 1/1658 292/137 |

(Continued)

FOREIGN PATENT DOCUMENTS

TW M386520 8/2010

*Primary Examiner* — Katherine Mitchell
*Assistant Examiner* — Marcus Menezes

(57) ABSTRACT

A waterproof lockable door and a pressure adjusted plug thereof are provided. An electronic device is formed with an opening having an annular wall. The waterproof lockable door includes a cover member having at least one through hole and a pressure adjusted plug including a waterproof member and at least one fastening unit. The waterproof member includes at least one fastening hole. The fastening unit is formed with a head portion and a rod portion, and the rod portion is received in the through hole and moves relative to the cover member, thereby driving the outer periphery of the waterproof member to be tightly adjacent to annular wall. Accordingly, the tolerance of the annular wall and the waterproof member and the air pressure inside an opening both force the waterproof member to move.

11 Claims, 8 Drawing Sheets

(56) References Cited

U.S. PATENT DOCUMENTS

| | | | |
|---|---|---|---|
| 8,089,757 B2 | 1/2012 | Chen et al. | |
| 8,764,073 B2* | 7/2014 | Lin | E05B 17/002 |
| | | | 277/637 |
| 9,317,077 B2* | 4/2016 | Mori | G06F 1/1616 |
| 9,390,746 B2* | 7/2016 | Lee | G11B 17/04 |
| 2011/0198119 A1* | 8/2011 | Kajiyama | H05K 5/0239 |
| | | | 174/520 |
| 2012/0144749 A1* | 6/2012 | Lin | E05B 17/002 |
| | | | 49/394 |
| 2013/0286569 A1* | 10/2013 | Murakata | H05K 5/0086 |
| | | | 361/679.01 |

* cited by examiner

WATERPROOF LOCKABLE DOOR AND PRESSURE ADJUSTED PLUG THEREOF

BACKGROUND OF THE INVENTION

Field of the Invention

The present invention relates to a lockable door structure used in an electronic device, especially to a waterproof lockable door and a pressure adjusted plug thereof.

Description of Related Art

With the development of computer technology and the related hardware, a notebook computer becomes the main stream in the market. For providing a space for the user to upgrade or expand the equipment, certain models allowing the user to expand the hardware have been developed by skilled people in the art. One or a plurality of openings are formed in the above-mentioned models, and a reserved space is formed inside the housing of the models. The reserved space allows the consumer to freely assemble the hardware by himself/herself, thereby providing more convenience for the user to install or detach the hardware.

On the other hand, for preventing dust or water from entering the interior of the housing through the opening, a cover member is installed at the opened area formed on the surface of the housing thereby achieving an effect of shielding or closing the opening. Take the U.S. Pat. No. 7,789,437 for example, a lockable door assembly is disclosed for being used in a notebook computer and fastened on a housing thereof. The backside of the lockable door assembly is installed with a waterproof pad, thereby allowing the waterproof pad to be disposed between the lockable door assembly and the opening, so effects of easy operation, dustproof and waterproof are provided.

However, the lockable door assembly disclosed in the U.S. Pat. No. 7,789,437 has following shortages: firstly, the installation tolerance of the waterproof pad and the opening has to be precise, or poor airtight is caused at the location where the waterproof pad and the opening being engaged and the waterproof capability is lowered; secondly, when the waterproof pad is plugged into the opening, the waterproof pad compresses the air inside the opening, so the user has to apply a greater force to place the waterproof pad to a preset location and the design causes bad user experience.

In view of the above-mentioned shortages, the applicant of the present invention has devoted himself for inventing a novel design to solve the above-mentioned shortages.

SUMMARY OF THE INVENTION

The present invention is to provide a waterproof lockable door and automatic pressure adjusted plug thereof, wherein when the outer periphery of a waterproof member is tightly adjacent to an annular wall, the tolerance of the annular wall and the waterproof member and the air pressure inside an opening both force the waterproof member to move, thereby increasing the airtight capability of the waterproof member and enhancing the operation convenience.

Accordingly, the present invention provides a waterproof lockable door, which is used in an electronic device, the electronic device is formed with an opening, the inner periphery of the opening is formed with an annular wall, and the waterproof lockable door includes:

a cover member, pivoted with the electronic device and arranged corresponding to the opening, and formed with at least a through hole; and a pressure adjusted plug, connected to one side of the cover member, and including:

a waterproof member, formed with at least a fastening hole; and at least a fastening unit, formed with a head portion and a rod portion, wherein the rod portion is received in the through hole and correspondingly fastened in the fastening hole, thereby allowing the cover member to be kept between the head portion and the waterproof member;

wherein, when the cover member is covered corresponding to the opening, the waterproof member is inserted into the opening, and the rod portion is received in the through hole and generates a movement relative to the cover member, thereby driving the outer periphery of the waterproof member to be tightly adjacent to the annular wall.

Accordingly, the present invention provides a pressure adjusted plug, which is used in a cover member, the cover member is formed with at least a through hole, and the pressure adjusted plug includes:

a waterproof member, formed with at least a fastening hole; and at least a fastening unit, formed with a head portion and a rod portion, wherein the rod portion is received in the through hole and correspondingly fastened in the fastening hole, thereby allowing the cover member to be kept between the head portion and the waterproof member;

wherein, the rod portion is received in the through hole and generates a movement relative to the cover member.

In comparison with related art, the present invention has advantageous features as following.

Firstly, under the situation of the waterproof member being a mobile member, when the waterproof member is plugged into the opening, an interfere force generated due to the tolerance of the annular wall and the waterproof member forces the waterproof member to move, so the outer periphery of the waterproof member is enabled to be more tightly adjacent to the annular wall, thereby increasing the airtight efficiency of the waterproof member and enhancing the sealing effect.

Secondly, under the situation of the waterproof member being a mobile member, when the waterproof member is plugged into the opening, air pressure generated through the waterproof member compressing the air inside the opening forces the waterproof member to move, so a user can apply a smaller force to plug the waterproof member to a preset location, thereby the waterproof lockable door being provided with an advantage of convenient in use.

Thirdly, the waterproof member includes a plate and a replaceable elastic ring sleeved at the outer periphery of the plate, so the replaceable elastic ring is detachably installed on the plate, when the replaceable elastic ring is damaged or aged, the replaceable elastic ring can be removed from the plate and a new replaceable elastic ring can be used for replacement, thus the waterproof lockable door of the present invention is provided with an advantage of low cost in maintenance.

Fourthly, the waterproof member includes a plate and a replaceable elastic ring sleeved at the outer periphery of the plate, when the replaceable elastic ring is expanded by heating or shrunk by cooling, the replaceable elastic ring is supported by the plate thereby preventing from being deformed, so the waterproof lockable door is provided with an effective waterproof sealing effect.

DETAILED DESCRIPTION OF THE INVENTION

Figure 1:
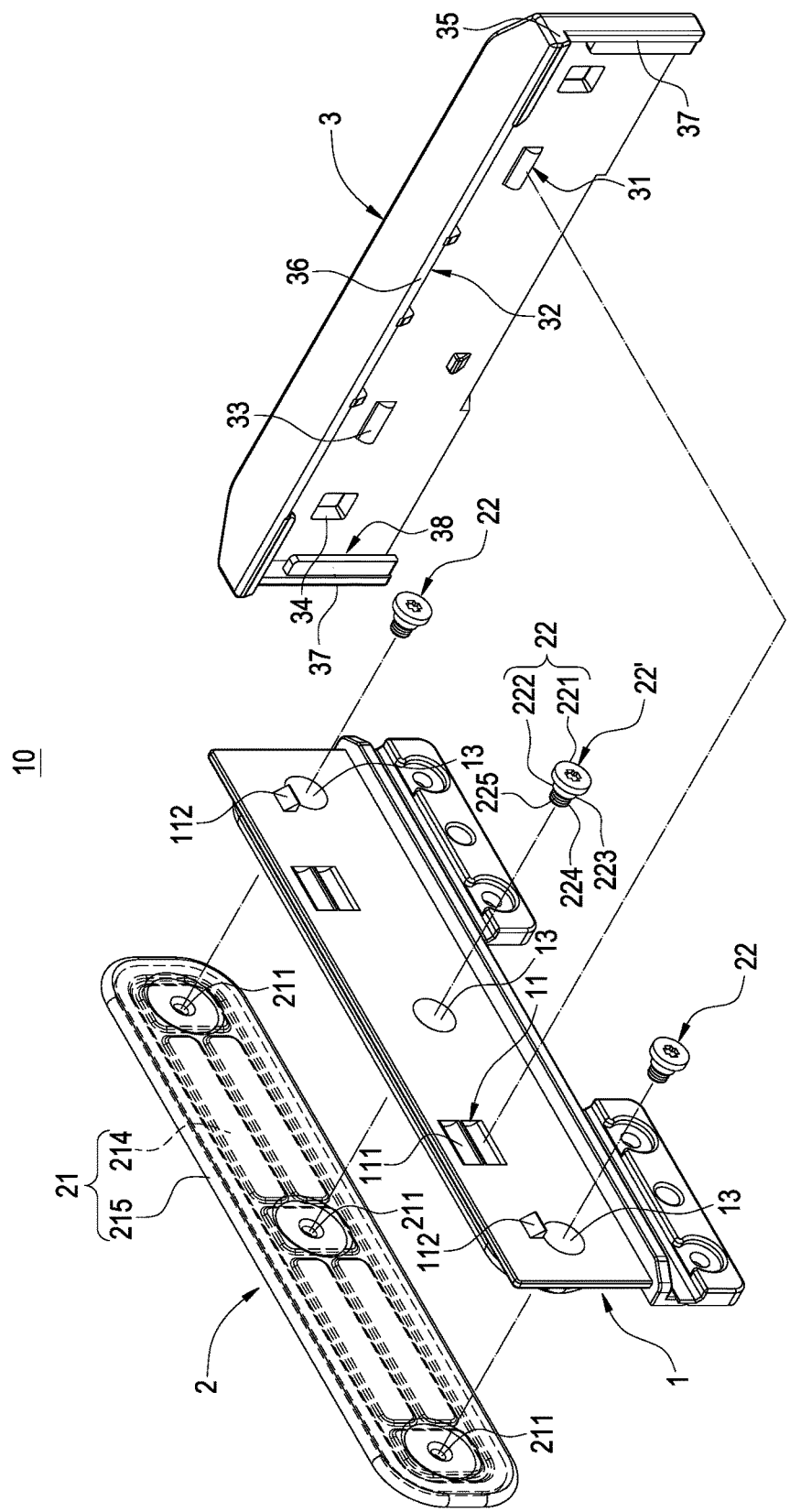
FIG. 1 is a perspective and exploded view showing the waterproof lockable door according to a first embodiment of the present invention.

Preferred embodiments of the present invention will be described with reference to the drawings.

Please refer to from FIG. 1 to FIG. 6, which disclose a waterproof lockable door 10 according to a first embodiment of the present invention. The present invention provides a waterproof lockable door and a pressure adjusted plug thereof. The waterproof lockable door 10 mainly includes a cover member 1 and a pressure adjusted plug 2. The pressure adjusted plug 2 mainly includes a waterproof member 21 and one or a plurality of fastening units 22.

Figure 5:
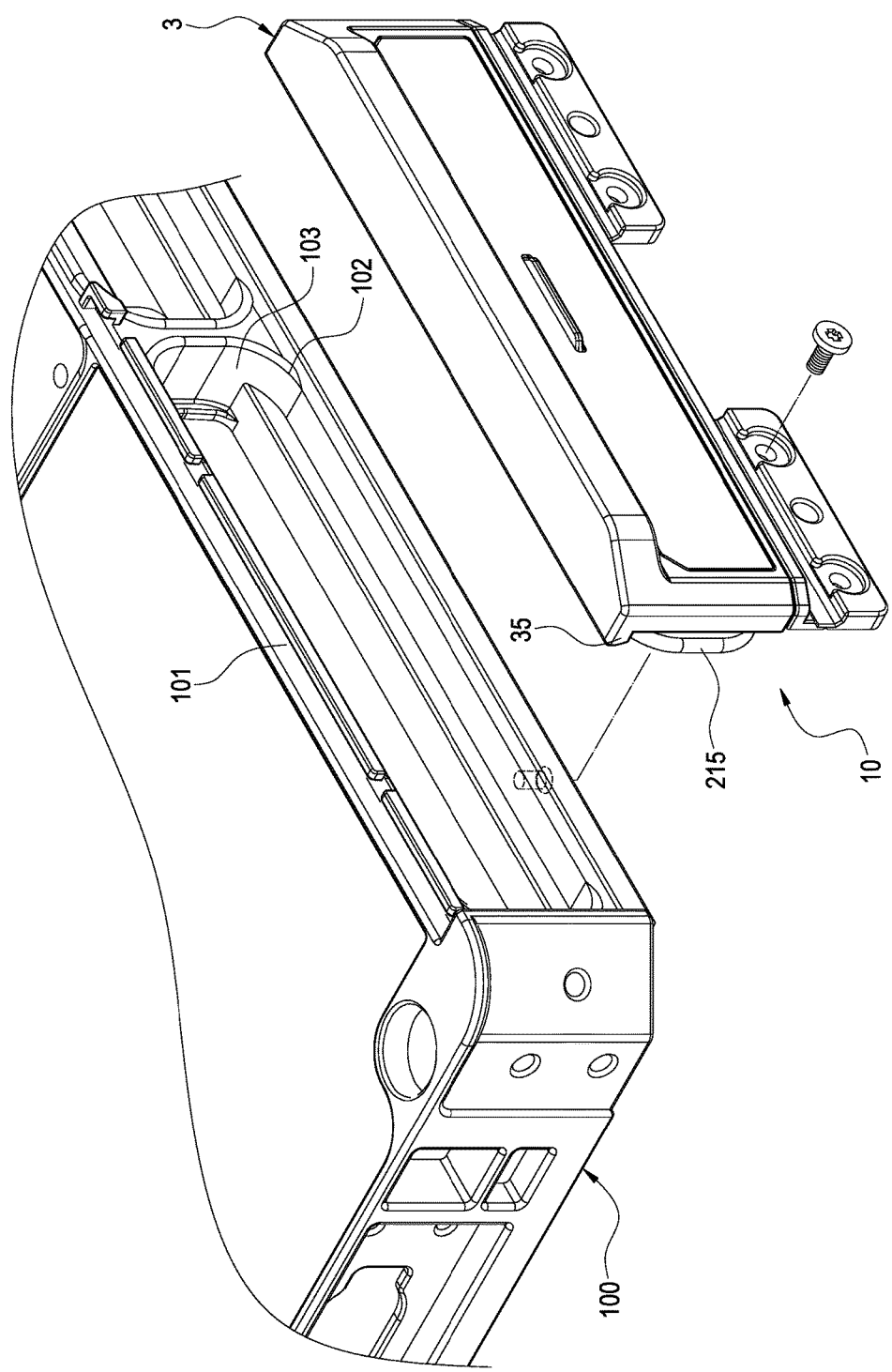
FIG. 5 is another perspective exploded view showing the waterproof lockable door according to the first embodiment of the present invention.
Figure 6:
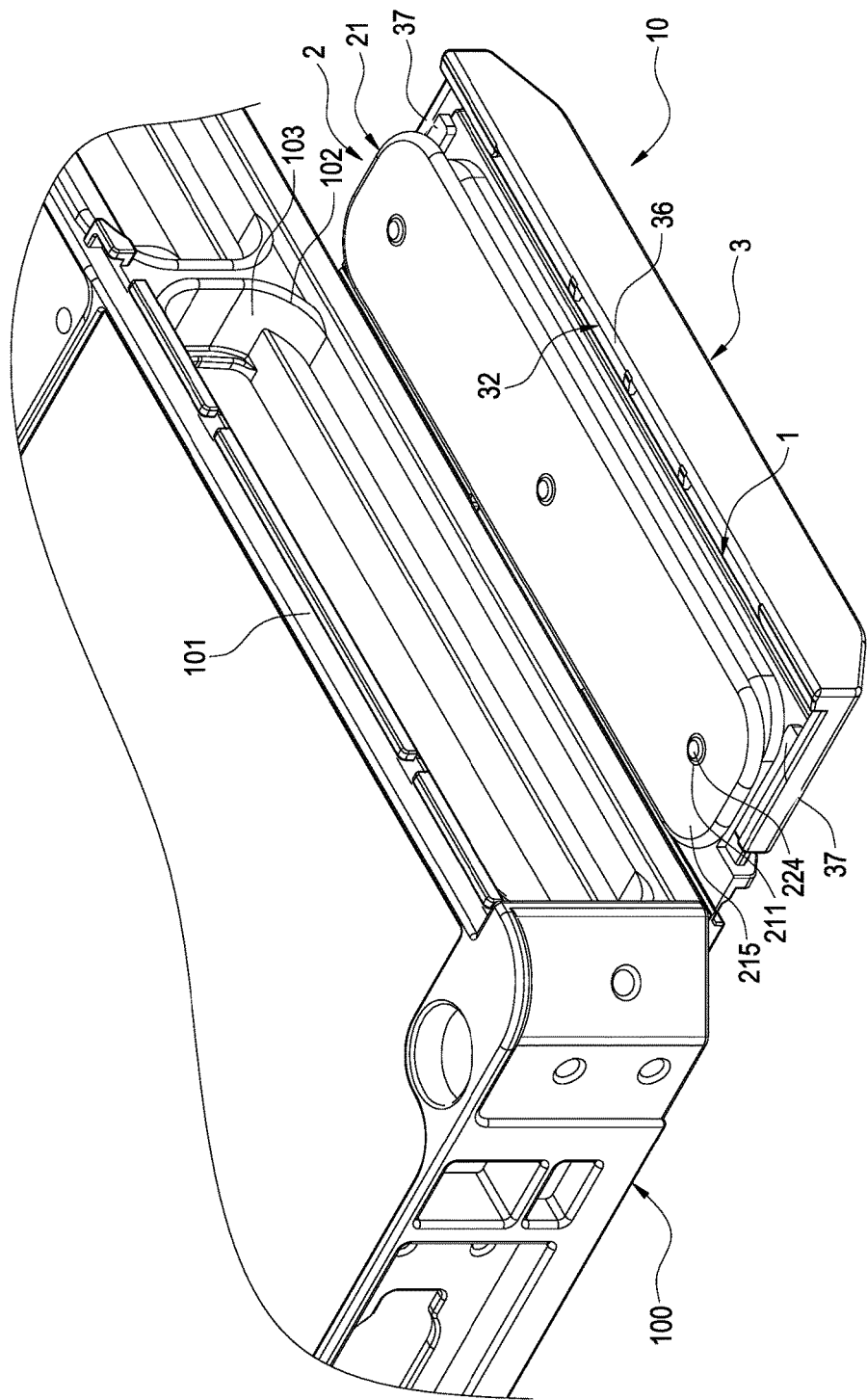
FIG. 6 is another perspective view showing the assembly of the waterproof lockable door according to the first embodiment of the present invention.

As shown in FIG. 5 and FIG. 6, the waterproof lockable door 10 is used in an electronic device 100, and the electronic device 100 is formed with a buckle part 101. The buckle part 101 is, for example a latch groove formed in the electronic device 100, but not limited thereto. The electronic device 100 is formed with an opening 102, and an annular wall 103 is formed at the inner periphery of the opening 102.

As shown from FIG. 1 to FIG. 4, the cover member 1 is pivoted with the electronic device 100 and disposed correspondingly to the opening 102, and the cover member 1 is formed with a latch part 11 and one or a plurality of through holes 12. The surface of the cover member 1 away from the waterproof member 21 is formed with a mount hole 13 communicated with the through hole 12.

A further illustration is that the latch part 11 is formed as two rows of concave grooves 111 longitudinally formed and arranged on the cover member 1; in addition, the cover member 1 is extended with two stop pieces 112 at the locations corresponding to two outer sides of the concave grooves 111.

Figure 2:
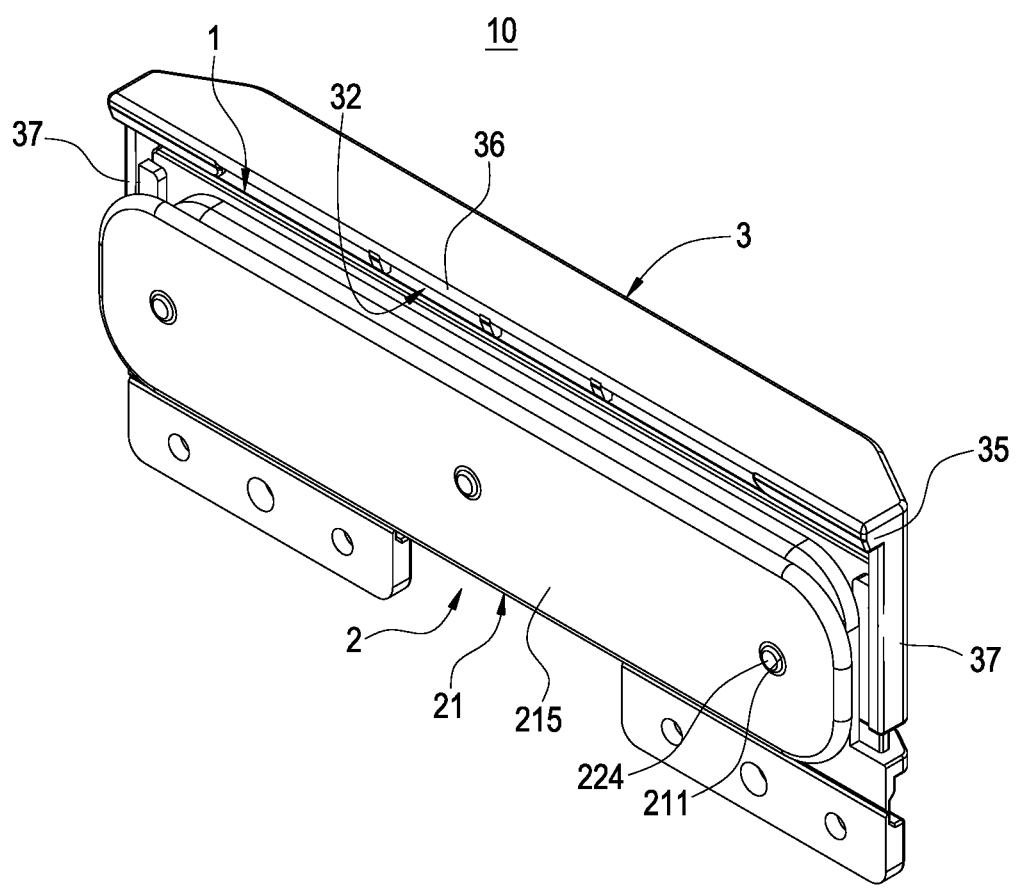
FIG. 2 is a perspective view showing the assembly of the waterproof lockable door according to the first embodiment of the present invention.
Figure 3:
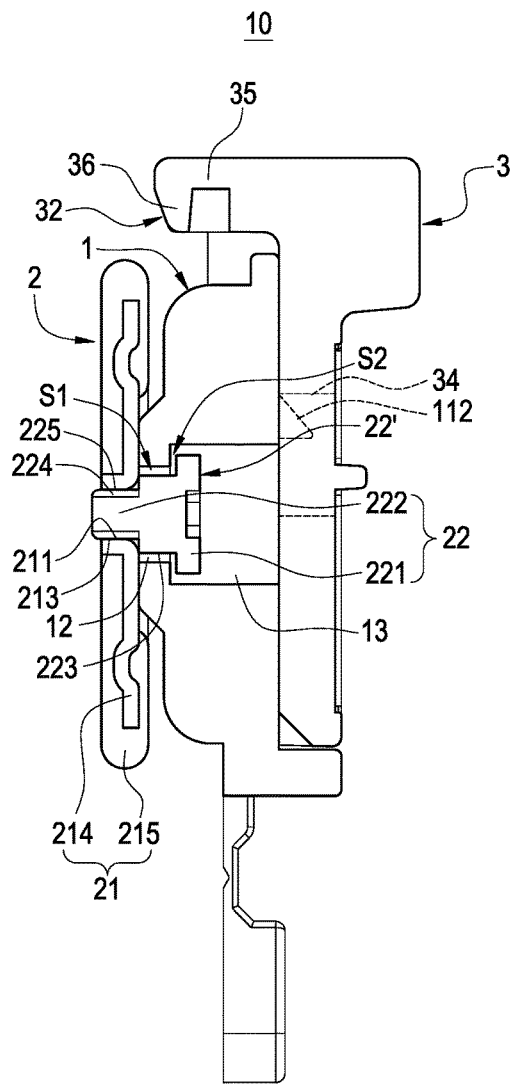
FIG. 3 is a cross sectional view along a plane penetrating through elements 21 and 211 in FIG. 1 showing the waterproof lockable door according to the first embodiment of the present invention.
Figure 4:
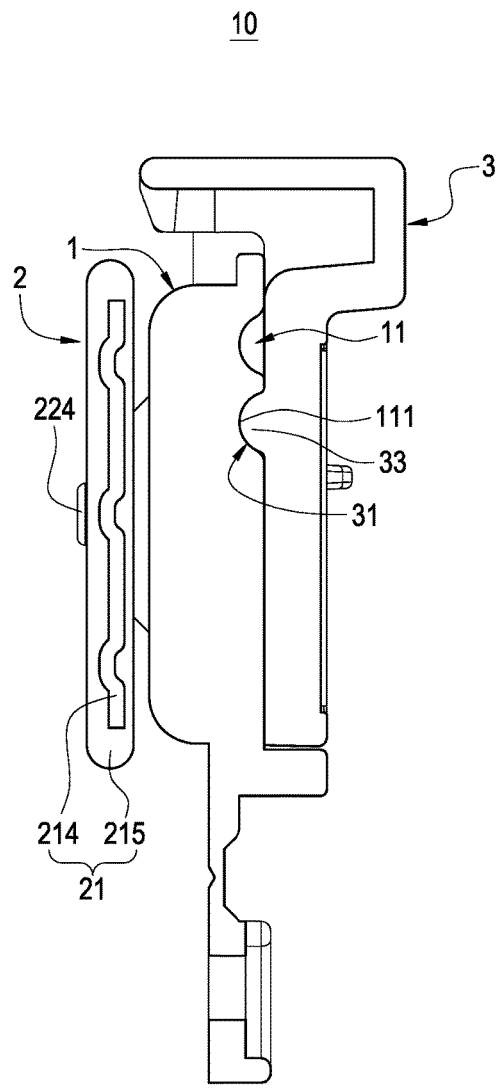
FIG. 4 is another cross sectional view along a plane penetrating through element 111 in FIG. 1 showing the waterproof lockable door according to the first embodiment of the present invention.

As shown from FIG. 1 to FIG. 3, the pressure adjusted plug 2 is connected to one side of the cover member 1, and includes the above-mentioned waterproof member 21 and one or a plurality of the above-mentioned fastening units 22. The waterproof member 21 is formed with one or a plurality of the fastening holes 211. The fastening unit 22 is formed with a head portion 221 and a rod portion 222. The rod portion 222 is received in the through hole 12 and correspondingly fastened in the fastening hole 221, thereby allowing the cover member 1 to be kept between the head portion 221 and the waterproof member 21.

A further illustration is that the rod portion 222 is formed with a first segment 223 and a second segment 224. The first segment 223 is correspondingly received in the through hole 12, and the second segment 224 is correspondingly fastened in the fastening hole 211. Wherein, the hear portion 221 is mounted in the mount hole 13.

Moreover, the fastening unit 22 is formed as a stepped screw 22', and the outer diameter of the first segment 223 is larger than that of the second segment 224. The second segment 224 is formed with an outer thread 225, the waterproof member 21 is formed with an inner thread 213 inside the fastening hole 211, and the outer thread 225 is correspondingly fitted with the inner thread 213.

Please refer to FIG. 3, the diameter of the first segment 223 is smaller than the diameter of the through hole 12, thereby forming a radial spacing S1 due to the radius difference between the first segment 223 and the through hole 12. The length of the first segment 223 is larger than the thickness of the cover member 1, thereby forming an axial spacing S2 due to the difference between the length of the first segment 223 and the thickness of the cover member 1. When the pressure adjusted plug 2 is abutted against the cover member 1, a gap having the axial spacing S2 is formed between the head portion 221 and the cover member 1. Wherein, the radial spacing S1 and the axial spacing S2 are most preferably to be between 0.2 mm to 0.4 mm, however the scope of the present invention is not limited to the above-mentioned, the spacing can be determined according to the actual needs.

The waterproof member 21 includes a plate 214 and an elastic member 215 covering the exterior of the plate 214. The fastening hole 211 is formed on the plate 214 and exposed outside the elastic member 215. Wherein, the elastic member 215 is made of an elastic waterproof material such as rubber or silicone.

When the cover member 1 is covered corresponding to the opening 102, the waterproof member 21 is inserted into the opening 102, and the rod portion 222 is received in the through hole 12 and generates a movement relative to the cover member 1, thereby driving the outer periphery of the waterproof member 21 to be tightly adjacent to the annular wall 103.

As shown from FIG. 1 to FIG. 4, the waterproof lockable door 10 further includes an actuation pull member 3. The actuation pull member 3 is connected to and slides on another side of the cover member 1. The actuation pull member 3 is formed with a latch connecting part 31 corresponding to the latch part 11 and a buckle connecting part 32 corresponding to the buckle part 101. By sliding the actuation pull member 3, the latch connecting part 31 and the latch part 11 are enabled to be adjusted and positioned in a multiple-stage manner, so the buckle connecting part 32 is enabled to be buckled with the buckle part 101.

A further illustration is that the latch connecting part 31 is formed as two protrusions 33 extended from the actuation pull member 3. Each of the protrusions 33 is able to be latched in one of the concave grooves 111 formed in each row.

In addition, the actuation pull member 3 is formed with two position limiting grooves 34 at the locations corresponding to two outer sides of the two protrusions 33. Each of the stop pieces 112 is able to be moved and positioned in each of the position limiting grooves 34.

Moreover, the top of the actuation pull member 3 is extended with an extending end 35. The buckle connecting part 32 is formed as a mount piece 36 downwardly extended from the extending end 35. The mount piece 36 is able to be correspondingly buckled with the buckle part 101.

Moreover, two opposite sides of the actuation pull member 3 are extended with a pair of L-shaped stop walls 37, and a rail 38 is respectively formed in the interior of each of the two L-shaped stop walls 37. Two sides of the cover member 1 are accommodated in the two L-shaped stop walls 37, thereby enabling the actuation pull member 3 to slide relative to the cover member 1 through the rails 38.

As shown from FIG. 1 to FIG. 6, the assembly of the waterproof lockable door 10 is that the cover member 1 is pivoted with the electronic device 100 and disposed correspondingly to the opening 102 and the cover member 1 is formed with the through hole 12; the pressure adjusted plug 2 is connected at one side of the cover member 1 and formed with the fastening hole 211; the fastening unit 22 is formed with the head portion 221 and the rod portion 222, and the rod portion 222 is received in the through hole 12 and correspondingly fastened in the fastening hole 211, thereby allowing the cover member 1 to be kept between the head portion 221 and the waterproof member 21. Wherein, when the cover member 1 is covered corresponding to the opening 102, the waterproof member 21 is inserted into the opening 102. The rod portion 222 is received in the through hole 12 and generates a movement relative to the cover member 1, thereby driving the outer periphery of the waterproof member 21 to be tightly adjacent to the annular wall 103.

As shown from FIG. 1 to FIG. 6, the assembly of the pressure adjusted plug 2 is that the waterproof member 21 is formed with the fastening hole 221; the fastening unit 22 is formed with the head portion 221 and the rod portion 222, and the rod portion 222 is received in the through hole 12 and correspondingly fastened in the fastening hole 211, thereby allowing the cover member 1 to be kept between the head portion 221 and the waterproof member 21. Wherein, the rod portion 222 is received in the through hole 12 and generates a movement relative to the cover member 1.

Accordingly, the diameter of the first segment 223 is smaller than the diameter of the through hole 12, thereby forming the radial spacing S1 due to the radius difference between the first segment 223 and the through hole 12. The length of the first segment 223 is larger than the thickness of the cover member 1, thereby forming the axial spacing S2 due to the difference between the length of the first segment 223 and the thickness of the cover member 1. When the pressure adjusted plug 2 is abutted against the cover member 1, the gap having the axial spacing S2 is formed between the head portion 221 and the cover member 1. The rod portion 222 is enabled to be received in the through hole 12 and to generate a movement relative to the cover member 1 through the radial spacing S1 and the axial spacing S2. So when the outer periphery of the waterproof member 21 is tightly adjacent to the annular wall 103, the tolerance of the annular wall 103 and the waterproof member 21 and the air pressure inside the opening 102 force the waterproof member 21 to move, thereby increasing the airtight capability of the waterproof member 21 and enhancing the operation convenience.

Figure 7:
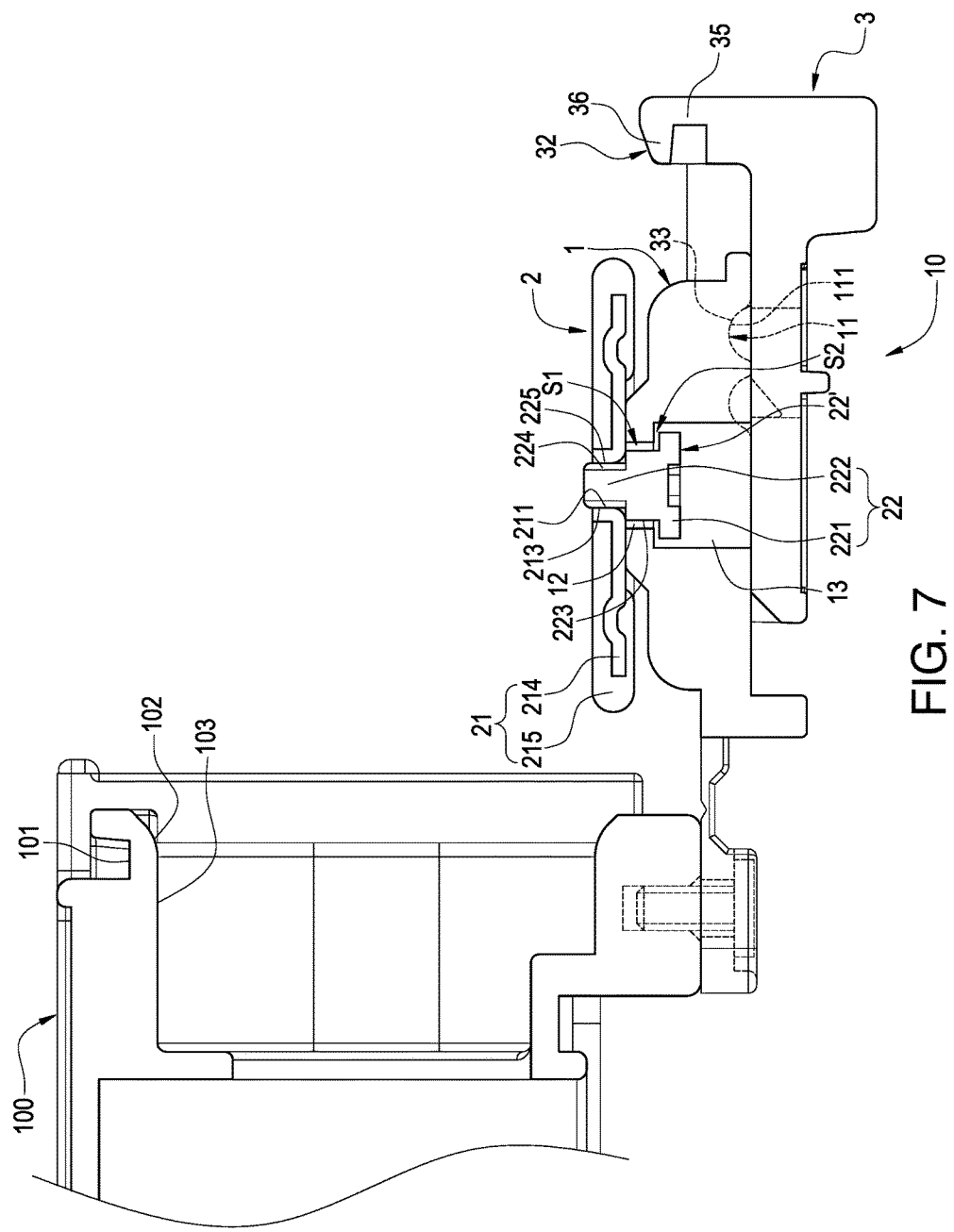
FIG. 7 is a schematic view showing the operating status of the waterproof lockable door according to the first embodiment of the present invention.
Figure 8:
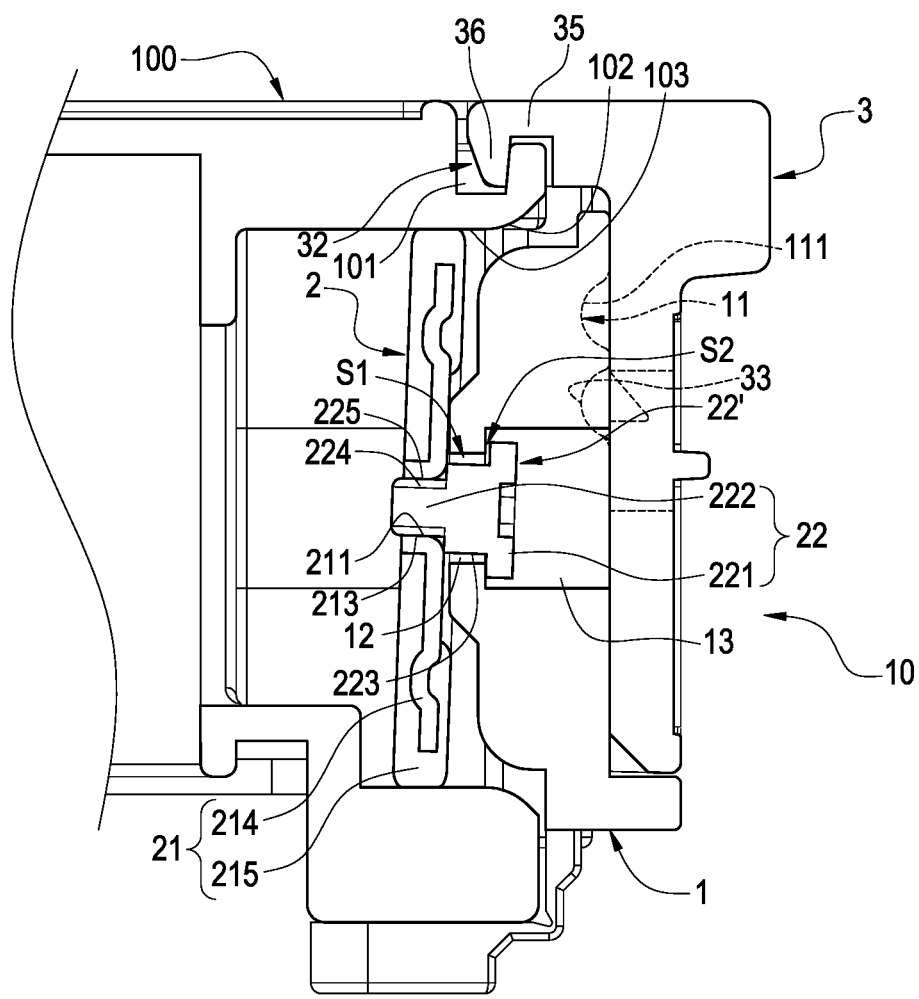
FIG. 8 is another schematic view showing the operating status of the waterproof lockable door according to the first embodiment of the present invention.

Please refer to FIG. 7 and FIG. 8, which disclose the operating status of the waterproof lockable door 10 provided by the present invention. The steps of the waterproof lockable door 10 being closed corresponding to the opening 102 are: firstly, when the cover member 1 is covered corresponding to the opening 102, the waterproof member 21 is inserted into the opening 102, because the radial spacing S1 is formed between the first segment 223 and the through hole 12, and the gap having the axial spacing S2 is formed between the head portion 221 and the cover member 1, the rod portion 222 is enabled to generate an up/down or left/right movement in the through hole 12 and relative to the cover member 1 through the radial spacing S1 and the axial spacing S2, thereby driving the outer periphery of the waterproof member 21 to be more tightly adjacent to the annular wall 103; and secondly, when the actuation pull member 3 is downwardly slid, each of the protrusions 33 is enabled to be latched in one of the concave grooves 111 at a relatively lower location, thereby allowing the buckle connecting part 32 to be buckled with the buckle part 101.

The step of the waterproof lockable door 10 being opened corresponding to the opening 102 is: when the actuation pull member 3 is upwardly slid, each of the protrusions 33 is enabled to be latched in one of the concave grooves 111 at a relatively higher location, thereby allowing the buckle connecting part 32 to be released from the buckle part 101.

Accordingly, under the situation of the waterproof member 21 being a mobile member, when the waterproof member 21 is plugged into the opening 102, an interfere force generated due to the tolerance of the annular wall 103 and the waterproof member 21 forces the waterproof member 21 to move, so the outer periphery of the waterproof member 21 is enabled to be more tightly adjacent to the annular wall 103, thereby increasing the airtight efficiency of the waterproof member 21 and enhancing the sealing effect.

Accordingly, under the situation of the waterproof member 21 being a mobile member, when the waterproof member 21 is plugged into the opening 102, air pressure generated through the waterproof member 21 compressing the air inside the opening 102 forces the waterproof member 21 to move, so a user does not need to apply an additional force to against the pressure generated by the air pressure, the user can only apply a smaller force to plug the waterproof member 21 to a preset location, thereby the waterproof lockable door 10 being provided with an advantage of convenient in use.

Figure 9:
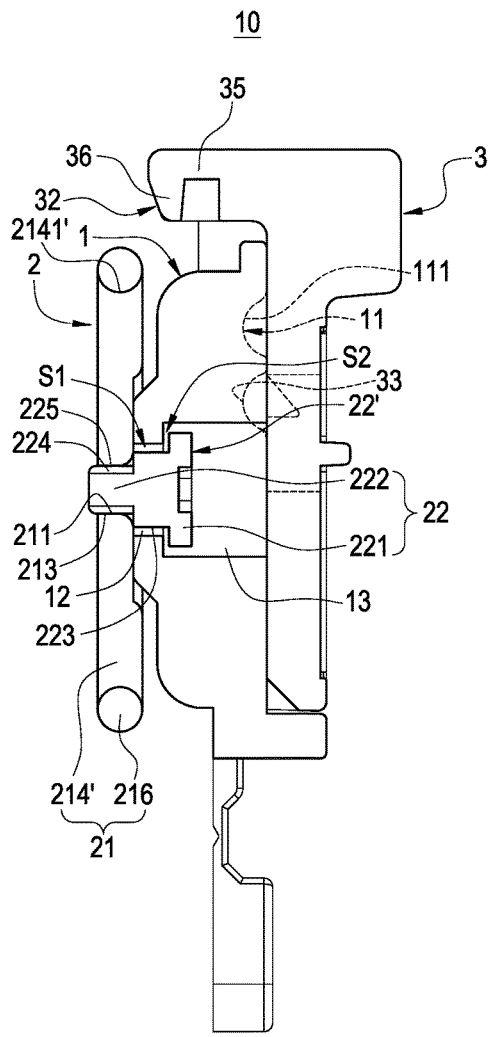
FIG. 9 is a cross sectional view along a plane penetrating through elements 21 and 211 in FIG. 1 showing the waterproof lockable door according to a second embodiment of the present invention.

Please refer to FIG. 9, which discloses a second embodiment illustrating the waterproof lockable door 10 and the waterproof member 21 provided by the present invention. The second embodiment is substantially the same as the first embodiment, and the difference between the two is the configuration of the waterproof member 21.

A detail illustration is that the waterproof member 21 includes a plate 214' and a replaceable elastic ring 216 sleeved at the outer periphery of the plate 214'. The fastening hole 211 is formed on the plate 214'. In addition, the outer periphery of the plate 214' is formed with an annular groove 2141', and the replaceable elastic ring 216 is positioned in the annular groove 2141'. Wherein, the replaceable elastic ring 216 is made of an elastic waterproof material such as rubber or silicone.

Accordingly, the configuration of the waterproof member 21 disclosed in the second embodiment is different from that disclosed in the first embodiment, but the second embodiment is provided with the same function and effect as the first embodiment.

In addition, the replaceable elastic ring 216 is detachably installed on the plate 214', when the replaceable elastic ring 216 is damaged or aged, the replaceable elastic ring 216 can be removed from the plate 214' and a new replaceable elastic ring 216 can be used for replacement. Thus, the waterproof lockable door 10 of the present invention is provided with an advantage of low cost in maintenance.

Moreover, the replaceable elastic ring 216 is sleeved at the periphery of the plate 214', when thermal expansion or contraction happens to the replaceable elastic ring 216, the replaceable elastic ring 216 is supported by the plate 214' thereby preventing from being deformed, so the waterproof lockable door 10 is provided with an effective waterproof sealing effect.

Figure 10:
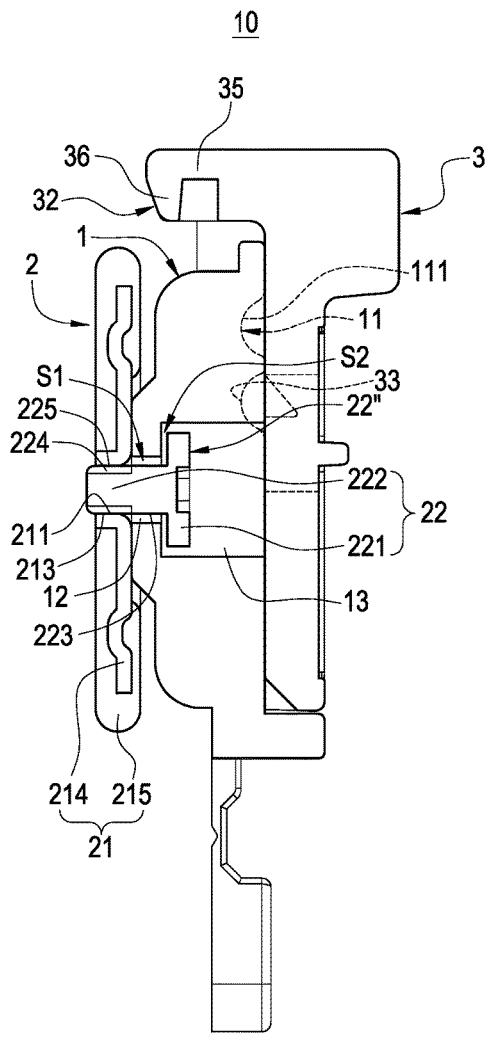
FIG. 10 is a cross sectional view along a plane penetrating through elements 21 and 211 in FIG. 1 showing the waterproof lockable door according to a third embodiment of the present invention.

Please refer to FIG. 10, which discloses a third embodiment illustrating the waterproof lockable door 10 and the waterproof member 21 provided by the present invention. The third embodiment is substantially the same as the first embodiment, and the difference between the two is the appearance of the fastening unit 22.

A detail illustration is that the fastening unit 22 is formed as a screw 22', and the outer diameter of the first segment 223 thereof is equal to the outer diameter of the second segment 224 thereof. The second segment 224 is formed with an outer thread 225, and the outer thread 225 is correspondingly fitted with the inner thread 213.

Accordingly, the appearance of the fastening unit 22 disclosed in the third embodiment is different from that disclosed in the first embodiment, but the third embodiment is provided with the same function and effect as the first embodiment.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A waterproof lockable door which is used in an electronic device comprising an opening, an annular-shaped wall being formed on an inner periphery of the opening, the waterproof lockable door comprising:
   a cover member, pivoted with respect to the electronic device and arranged adjacent to the opening, and comprising at least one through hole; and
   a pressure adjusted plug, connected to one side of the cover member, the pressure adjusted plug comprising:
      a waterproof member comprising at least one fastening hole; and
      at least one fastening unit, comprising a head portion and a rod portion, wherein the rod portion is received in the through hole and correspondingly fastened in the fastening hole, thereby holding the cover member between the head portion and the waterproof member;
   wherein, when the cover member covers the opening, the waterproof member is inserted into the opening, and the rod portion moves relative to the cover member, thereby driving an outer periphery of the waterproof member to engage the annular-shaped wall;
   wherein the rod portion comprises a first segment and a second segment, the first segment is received in the through hole, and the second segment is fastened in the fastening hole;
   wherein the fastening unit is formed as a stepped screw, an outer diameter of the first segment is larger than an outer diameter of the second segment, the second segment comprises an outer thread, the waterproof member comprises an inner thread inside the fastening hole, and the outer thread corresponding to and fitted with the inner thread.

2. The waterproof lockable door according to claim 1, wherein a length of the first segment is larger than a thickness of a wall of the cover member through which the through hole penetrates, thereby forming an axial space due to a difference between the length of the first segment and the thickness of the wall of the cover member.

3. The waterproof lockable door according to claim 1, wherein the waterproof member comprises a plate and an elastic member covering an exterior of the plate, wherein the fastening hole is formed in the plate and exposed by the elastic member.

4. The waterproof lockable door according to claim 1, wherein the waterproof member comprises a plate and a replaceable elastic ring sleeved at an outer periphery of the plate, wherein the fastening hole is formed in the plate.

5. The waterproof lockable door according to claim 4, wherein the outer periphery of the plate comprises annular-shaped groove, and the replaceable elastic ring is positioned in the annular-shaped groove.

6. The waterproof lockable door according to claim 1, wherein a surface of the cover member away from the waterproof member comprises a mount hole in communication with the through hole, and the head portion in mounted in the mount hole.

7. A waterproof lockable door which is used in an electronic device comprising a buckle part and an opening, an annular-shaped wall being formed on an inner periphery of the opening, the waterproof lockable door comprising:
   a cover member, pivoted with respect to the electronic device and arranged adjacent to the opening, and comprising a latch part and at least one through hole;
   a pressure adjusted plug, connected to a first side of the cover member, the pressure adjusted plug comprising:
      a waterproof member comprising at least one fastening hole; and
      at least one fastening unit, comprising a head portion and a rod portion, wherein the rod portion is received in the through hole and correspondingly fastened in the fastening hole, thereby holding the cover member between the head portion and the waterproof member, wherein, when the cover member covers the opening, the waterproof member is inserted into the opening, and the rod portion moves relative to the cover member, thereby driving an outer periphery of the waterproof member to engage the annular-shaped wall; and
   an actuation pull member connected to and sliding on a second side of the cover member, the actuation pull member comprising a latch connecting part corresponding to the latch part and a buckle connecting part corresponding to the buckle part, arranged such that by sliding the actuation pull member from an open position to a locked position, the latch connecting part and the latch part are adjusted and positioned in a multiple-stage manner, and in the locked position the buckle connecting part is buckled with the buckle part.

8. The waterproof lockable door according to claim 7, wherein the latch part comprises two rows of concave grooves longitudinally formed and arranged on the cover member, and the latch connecting part comprises two protrusions extended from the actuation pull member, and each of the protrusions is able to be latched in one of the concave grooves formed in each row.

9. The waterproof lockable door according to claim 8, wherein the cover member comprises two stop pieces at locations corresponding to two outer sides of the concave grooves, and the actuation pull member comprises two position limiting grooves at locations corresponding to two outer sides of the two protrusions, and each of the stop pieces is able to be moved and positioned in each of the position limiting grooves.

10. The waterproof lockable door according to claim 7, wherein two opposite sides of the actuation pull member comprise a pair of L-shaped stop walls, and a rail is respectively formed in an interior of each of the two L-shaped stop walls, and two sides of the cover member are accommodated in the two L-shaped stop walls, thereby enabling the actuation pull member to slide relative to the cover member through the rails.

11. The waterproof lockable door according to claim 7, wherein a top of the actuation pull member comprises an extending end, the buckle connecting part is formed as a mount piece downwardly extended from the extending end, and the mount piece corresponds to and is buckled with the buckle part.

\* \* \* \* \*